(12) United States Patent
Huang et al.

(10) Patent No.: US 7,803,246 B2
(45) Date of Patent: Sep. 28, 2010

(54) ETCHING SYSTEM

(75) Inventors: Tu-Yen Huang, Tainan County (TW); Yi-Hong Chen, Yunlin County (TW); Ta Chin Lee, Tainan City (TW); Shang-Sheng Wu, Tainan County (TW); Chiun-Tong Su, Kaohsiung City (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 698 days.

(21) Appl. No.: 11/695,629

(22) Filed: Apr. 3, 2007

(65) Prior Publication Data

US 2008/0245479 A1    Oct. 9, 2008

(51) Int. Cl.
*H01L 21/306* (2006.01)
*C23F 1/00* (2006.01)

(52) U.S. Cl. .............. 156/345.34; 156/345.51; 156/345.52; 156/345.53; 156/345.54; 156/345.55

(58) Field of Classification Search ............ 156/345.34, 156/345.51–345.55
See application file for complete search history.

(56) References Cited

U.S. PATENT DOCUMENTS

| | | | |
|---|---|---|---|
| 6,716,287 B1 * | 4/2004 | Santiago et al. | 118/729 |
| 6,926,802 B2 * | 8/2005 | Lee | 156/345.51 |
| 2007/0044719 A1 * | 3/2007 | Ku et al. | 118/728 |
| 2008/0236497 A1 * | 10/2008 | Vukovic et al. | 118/728 |

\* cited by examiner

*Primary Examiner*—Parviz Hassanzadeh
*Assistant Examiner*—Keath T Chen
(74) *Attorney, Agent, or Firm*—Thomas, Kayden, Horstemeyer & Risley

(57) ABSTRACT

An etching system. An etching chamber includes an exhaust port. A gas input pipe is connected to the etching chamber, inputting etching process gas thereinto. A top RF electrode is disposed above the etching chamber. A bottom RF electrode is disposed under the etching chamber and opposite the top RF electrode. The etching process gas is transformed into plasma by operation of the top and bottom RF electrodes. An exhaust pump is connected to the exhaust port, expelling the plasma from the etching chamber. A base is disposed in the etching chamber. A focus ring is disposed on the base, accommodating a wafer. The wafer is etched by the plasma. A barricade is disposed on the focus ring and corresponds to the exhaust port, regulating the plasma flowing through the wafer.

8 Claims, 4 Drawing Sheets

ETCHING SYSTEM

BACKGROUND OF THE INVENTION

1. Field of the Invention

The invention relates to an etching system, and more particularly to an etching system providing enhanced uniformity of etching applied to a wafer.

2. Description of the Related Art

After application of a photolithography process, a wafer is subject to etching by plasma in an etching chamber. Poly lines are thus produced on the wafer.

Referring to FIG. 1, a conventional etching system 1 comprises an etching chamber 10, a top RF (radio frequency) electrode 20, a quartz disk 30, a bottom RF (radio frequency) electrode 40, a base 50, a gas input pipe 60, an exhaust pump 70, and a focus ring 80.

The top RF electrode 20 and quartz disk 30 are disposed above the etching chamber 10. The top RF electrode 20 is disposed on the quartz disk 30. Here, the quartz disk 30 provides airtight functions to the etching chamber 10.

The base 50 is disposed in the etching chamber 10 and comprises a gas channel 51 extending from the interior of the base 50 to the exterior thereof in the etching chamber 10.

The bottom RF electrode 40 is disposed under the etching chamber 10 and base 50 and opposite the top RF electrode 20.

The gas input pipe 60 is connected to the gas channel 51 of the base 50 from the exterior of the etching chamber 10, inputting etching process gas into the etching chamber 10.

The exhaust pump 70 is disposed outside the etching chamber 10 and connected to an exhaust port 11 thereof. The focus ring 80 is disposed on the base 50.

As shown in FIG. 1, a wafer W, which has been processed with photolithography, is positioned in the focus ring 80. Namely, a wafer W having photoresist formed thereon is positioned in the focus ring 80. Etching process gas is input into the gas channel 51 of the base 50 via the gas input pipe 60 and further uniformly input into the etching chamber 10 from the base 50. The top RF electrode 20 and bottom RF electrode 40 operate to incur a capacitive effect in the etching chamber 10. Here, the etching process gas in the etching chamber 10 is subject to an electrochemical reaction and thereby ionized, transforming into plasma. The wafer W is etched by the plasma and portions, without the photoresist, thereof are removed thereby. Poly lines are thus produced on the wafer W. In another aspect, the plasma and corroded substances are expelled to the exterior of the etching chamber 10 or etching system 1 through the exhaust port 11 by the exhaust pump 70.

Nevertheless, a drawback occurs during the aforementioned etching process. Although the focus ring 80 concentrates the plasma on the wafer W, non-uniform flow or density distribution of the plasma is generated thereon due to powerful exhaust operation of the exhaust pump 70. Namely, above the wafer W, the flow speed or density of the plasma near the exhaust port 11 exceeds that far from the exhaust port 11. Specifically, the plasma with higher flow speed or density excessively etches the wafer W, while the plasma with lower flowing speed or density insufficiently etches the wafer W. Thus, the difference in critical dimension between the poly lines is large. Here, the critical dimension refers to the width of a poly line. For example, the difference in the critical dimension of the poly lines between the edges (near the exhaust port 11) and center of the wafer W may reach 9 nm. Accordingly, after the etched wafer W is cut into several chips, obviously widely varied electrical characteristics or capabilities result from the large difference in critical dimension of the poly lines thereon, thus reducing reliability of the chips.

Hence, there is a need for an etching system improving uniformity of flow or density distribution of plasma, effectively reducing the difference in critical dimension between poly lines.

BRIEF SUMMARY OF THE INVENTION

A detailed description is given in the following embodiments with reference to the accompanying drawings.

An exemplary embodiment of the invention provides an etching system comprising an etching chamber, a gas input pipe, a top RF electrode, a bottom RF electrode, an exhaust pump, a base, a focus ring, and a barricade. The etching chamber comprises an exhaust port. The gas input pipe is connected to the etching chamber, inputting etching process gas thereinto. The top RF electrode is disposed above the etching chamber. The bottom RF electrode is disposed under the etching chamber and opposite the top RF electrode. The etching process gas is transformed into plasma by operation of the top and bottom RF electrodes. The exhaust pump is connected to the exhaust port, expelling the plasma from the etching chamber. The base is disposed in the etching chamber. The focus ring is disposed on the base, accommodating a wafer. The wafer is etched by the plasma. The barricade is disposed on the focus ring and corresponds to the exhaust port, regulating the plasma flowing through the wafer.

The barricade comprises a connecting portion and a planar portion opposite the connecting portion. The connecting portion is connected to the focus ring.

The barricade comprises a connecting portion and a curved portion opposite the connecting portion. The connecting portion is connected to the focus ring.

The height of the barricade is between 3 mm and 8 mm.

The barricade comprises metal or ceramic.

The base comprises a gas channel connecting the gas input pipe to the etching chamber.

The etching system further comprises a quartz disk disposed between the etching chamber and the top RF electrode.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
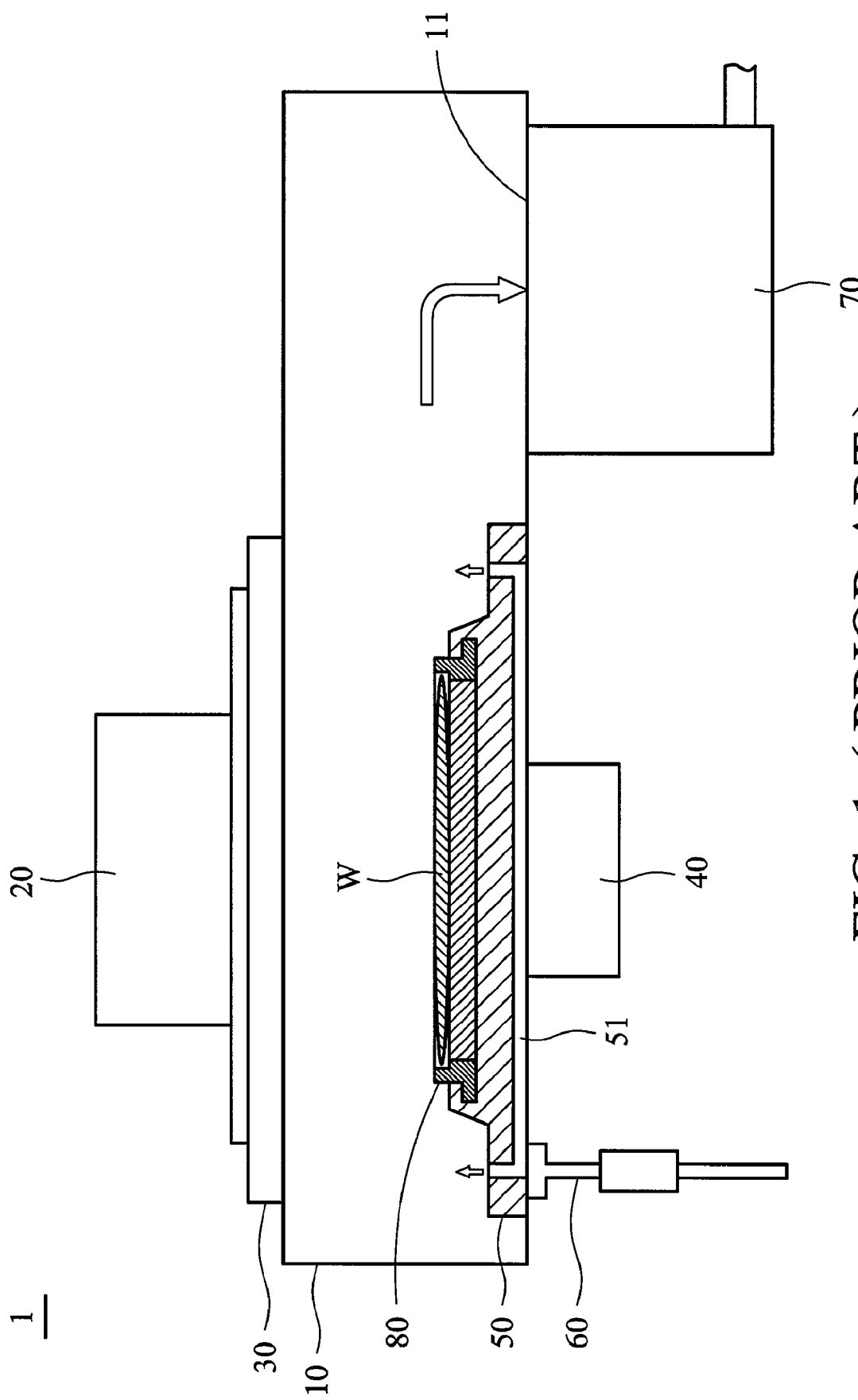
FIG. 1 is a partial side view and cross section of a conventional etching system.
Figure 2:
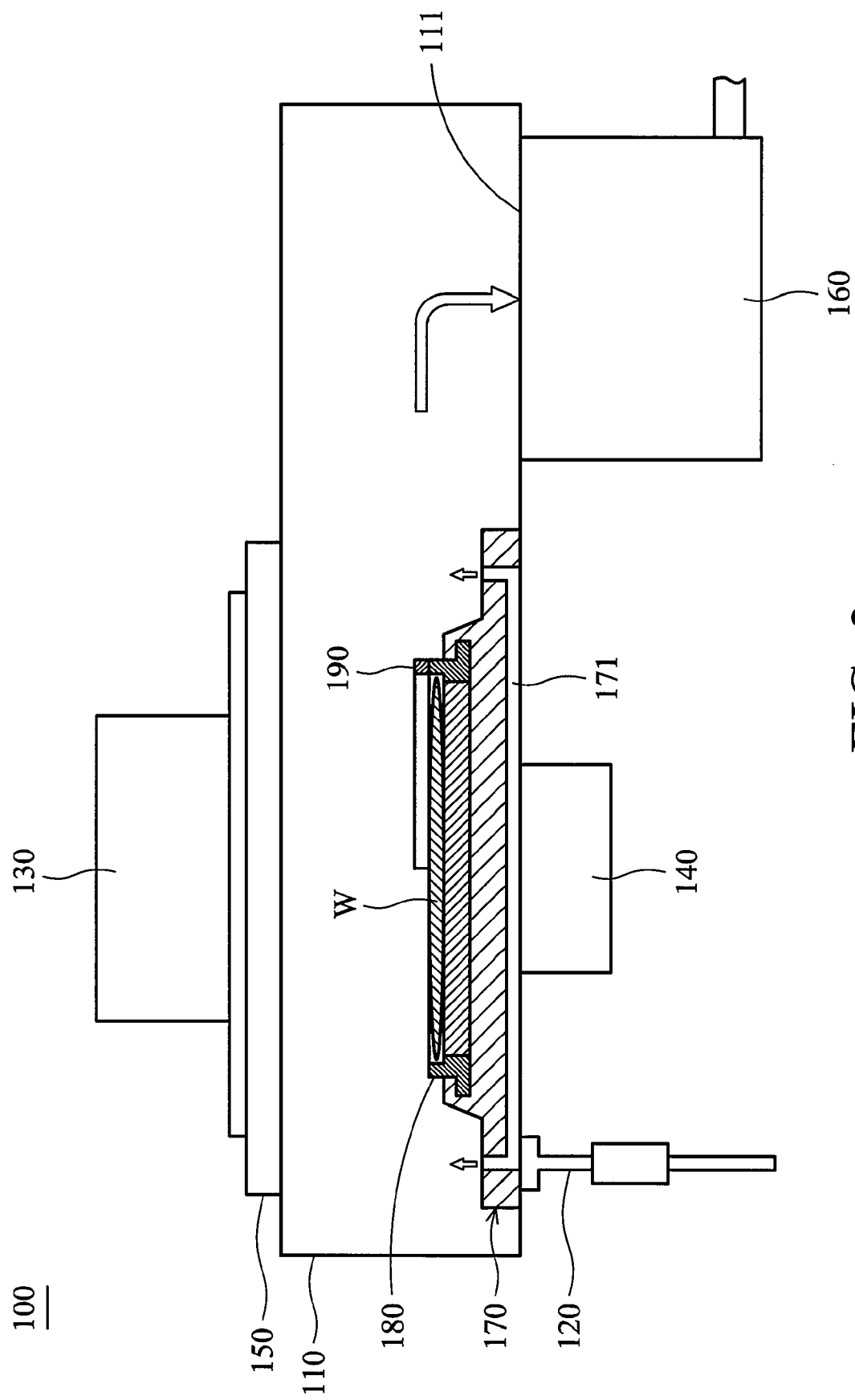
FIG. 2 is a partial side view and cross section of an etching system of an embodiment of the invention.

Referring to FIG. 2, an etching system 100 comprises an etching chamber 110, a gas input pipe 120, a top RF electrode 130, a bottom RF electrode 140, a quartz disk 150, an exhaust pump 160, a base 170, a focus ring 180, and a barricade 190.

The etching chamber 110 comprises an exhaust port 111. The exhaust pump 160 is disposed in the exterior of the etching chamber 110 and connected to the exhaust port 111.

The gas input pipe 120 is connected to the etching chamber 110, inputting etching process gas thereinto.

The top RF electrode 130 is disposed above the etching chamber 110. The quartz disk 150 is disposed between the etching chamber 110 and the top RF electrode 130, providing airtight functions to the etching chamber 110.

The bottom RF electrode 140 is disposed under the etching chamber 110 and opposite the top RF electrode 130.

The base 170 is disposed in the etching chamber 110 and comprises a gas channel 171 connecting the gas input pipe 120 to the etching chamber 110. Namely, the etching process gas transported by the gas input pipe 120 is input into the etching chamber 110 via the gas channel 171 of the base 170.

The focus ring 180 is disposed on the base 170, accommodating a wafer W, which has been processed by photolithography.

Figure 3:
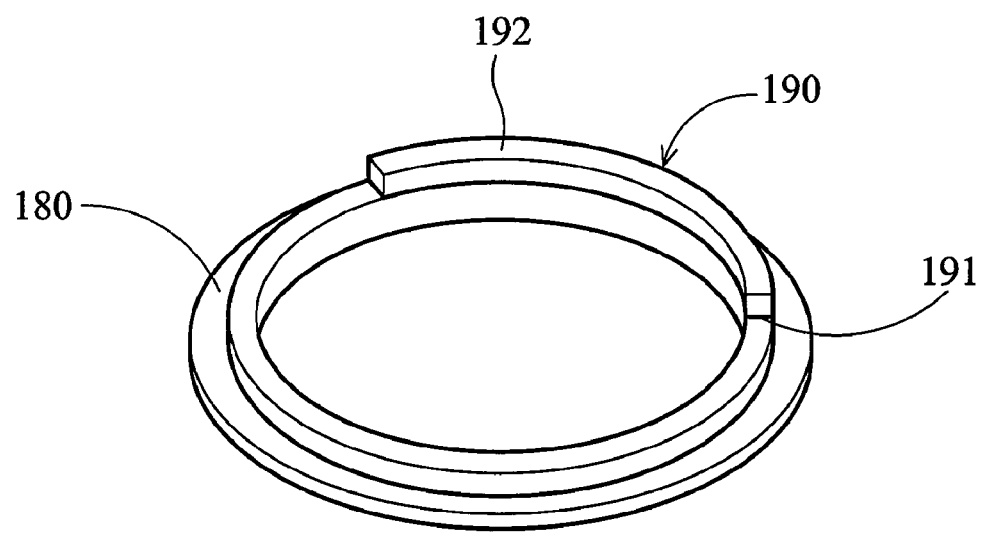
FIG. 3 is a schematic assembly view of a barricade and a focus ring of an embodiment of the invention.
Figure 4:
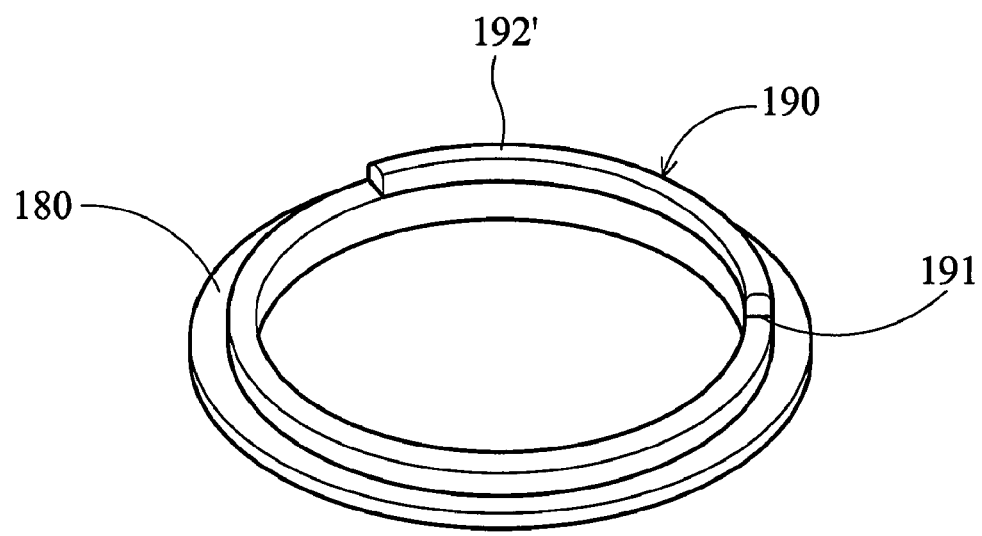
FIG. 4 is another schematic assembly view of a barricade and a focus ring of an embodiment of the invention.

The barricade 190 is disposed on the focus ring 180 and corresponds to the exhaust port 111 of the etching chamber 110. Namely, in addition to being disposed on the focus ring 180, the barricade 190 is near or adjacent to the exhaust port 111. Moreover, the barricade 190 and focus ring 180 may have the assembly structure shown in FIG. 3 or FIG. 4. As shown in FIG. 3, the barricade 190 comprises a connecting portion 191 and a planar portion 192 opposite the connecting portion 191, and the connecting portion 191 is connected to the focus ring 180. As shown in FIG. 4, the barricade 190 comprises a connecting portion 191 and a curved portion 192' opposite the connecting portion 191, and the connecting portion 191 is connected to the focus ring 180. Additionally, the height of the barricade 190 may vary from 3 mm to 8 mm, and the barricade 190 may comprise metal, ceramic, or other anticorrosive material.

The following description is directed to etching operation on a wafer using the etching system 100.

As shown in FIG. 2, after the wafer W having photoresist (not shown) formed thereon is positioned in the focus ring 180, the etching process gas is uniformly input into the etching chamber 110 via the gas input pipe 120 and gas channel 171 of the base 170. The top RF electrode 130 and bottom RF electrode 140 operate to incur a capacitive effect in the etching chamber 110. Here, the etching process gas in the etching chamber 110 is subject to an electrochemical reaction and thereby ionized, transforming into plasma. The wafer W is etched by the plasma and portions without the photoresist are removed thereby. Poly lines (not shown) are thus produced on the wafer W. In another aspect, the plasma and corroded substances are expelled to the exterior of the etching chamber 110 or etching system 100 through the exhaust port 111 by the exhaust pump 160.

Accordingly, as the barricade 190 corresponds to the exhaust port 111 of the etching chamber 110 (namely, the barricade 190 is near or adjacent to the exhaust port 111), the flow speed of the plasma on the wafer W near the exhaust port 111 is reduced. Uniformity of flow or density distribution of the plasma on the entire wafer W is enhanced. Namely, under powerful exhaust operation of the exhaust pump 160, uniformity of the flow or density distribution of the plasma on the entire wafer W is enhanced by obstruction of the barricade 190. Excessive and insufficient etching on the wafer W can thus be reduced or even prevented. Accordingly, after the aforementioned etching process, the difference in critical dimension between the poly lines on the wafer W is significantly reduced. For example, the difference in the critical dimension of the poly lines may be within 6 nm. Namely, the difference in the critical dimension of the poly lines between the edges (near the exhaust port 111) and center of the wafer W may be significantly reduced. Accordingly, after the etched wafer W is cut into several chips, significant variations in electric characteristics or capabilities thereof are reduced because of the significantly reduced difference in the critical dimension of the poly lines thereon, thus enhancing uniformity and reliability of the chips.

Figure 5:
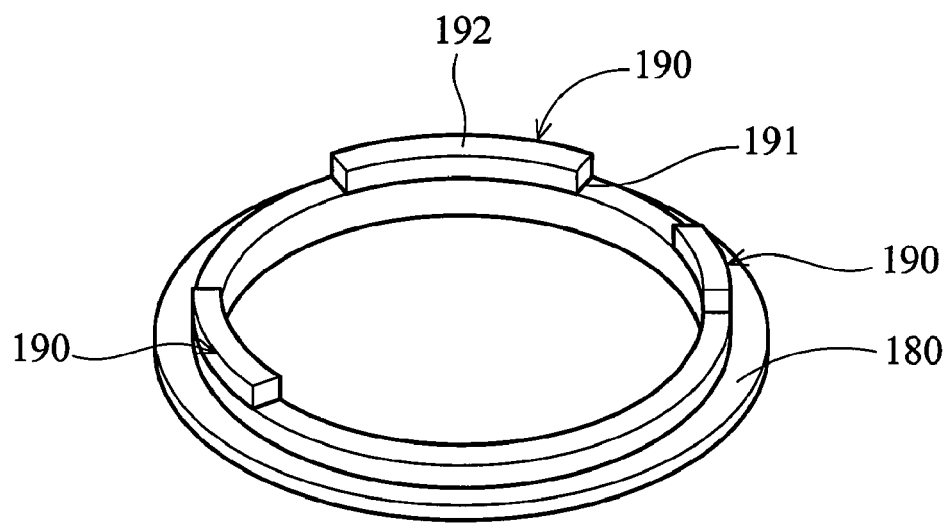
FIG. 5 is a schematic assembly view of multiple barricades and a focus ring of an embodiment of the invention.
Figure 6:
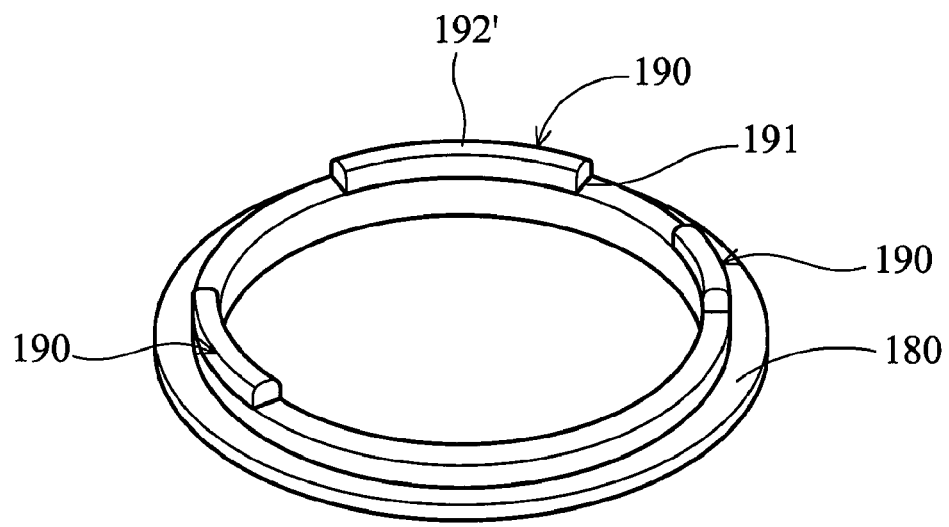
FIG. 6 is another schematic assembly view of multiple barricades and a focus ring of an embodiment of the invention.

Moreover, the disclosed etching system is not limited to an exhaust port and a barricade. Specifically, when the etching chamber of the etching system has multiple exhaust ports, multiple barricades 190 can be disposed on the focus ring 180 and separated from each other, as shown in FIG. 5 and FIG. 6. Similarly, the barricades 190 respectively correspond to the exhaust ports (namely, the barricades are respectively near or adjacent to the exhaust ports), reducing the flow speed of the plasma on the wafer near the exhaust ports, further enabling uniformity of flow or density distribution of the plasma on the entire wafer.

Similarly, as shown in FIG. 5, each barricade 190 comprises a connecting portion 191 and a planar portion 192 opposite the connecting portion 191, and the connecting portion 191 is connected to the focus ring 180. As shown in FIG. 6, each barricade 190 comprises a connecting portion 191 and a curved portion 192' opposite the connecting portion 191, and the connecting portion 191 is connected to the focus ring 180.

Additionally, the height of the barricades 190 may be the same or different and adjusted according to experimental results depicting the actual flow or density distribution of the plasma, enabling uniformity of the flow or density distribution of the plasma on the entire wafer, further enhancing uniformity of etching on the wafer.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An etching system, comprising:
an etching chamber comprising an exhaust port;
a gas input pipe connected to the etching chamber, inputting etching process gas thereinto;
a top RF electrode disposed above the etching chamber;
a bottom RF electrode disposed under the etching chamber and opposite the top RF electrode, wherein the etching process gas is transformed into plasma by operation of the top and bottom RF electrodes;
an exhaust pump connected to the exhaust port, expelling the plasma from the etching chamber;
a base disposed in the etching chamber;
wherein the exhaust port is at one lateral side of the base;
a focus ring disposed on the base, accommodating a wafer, wherein the wafer is etched by the plasma; and a partial ring-shaped gas flow barricade disposed on the focus ring and near the lateral side of the exhaust port, regulating the plasma flowing through the wafer.

2. The etching system as claimed in claim 1, wherein the barricade comprises a connecting portion and a planar portion opposite the connecting portion, and the connecting portion is connected to the focus ring.

3. The etching system as claimed in claim 1, wherein the barricade comprises a connecting portion and a curved portion opposite the connecting portion, and the connecting portion is connected to the focus ring.

4. The etching system as claimed in claim 1, wherein the height of the barricade is between 3 mm and 8 mm.

5. The etching system as claimed in claim 1, wherein the barricade comprises metal.

6. The etching system as claimed in claim 1, wherein the barricade comprises ceramic.

7. The etching system as claimed in claim 1, wherein the base comprises a gas channel connecting the gas input pipe to the etching chamber.

8. The etching system as claimed in claim 1, further comprising a quartz disk disposed between the etching chamber and the top RF electrode.

* * * * *